(12) United States Patent
Sheats et al.

(10) Patent No.: US 8,247,243 B2
(45) Date of Patent: Aug. 21, 2012

(54) SOLAR CELL INTERCONNECTION

(75) Inventors: Jayna Sheats, Palo Alto, CA (US); Phil Stob, Fremont, CA (US)

(73) Assignee: Nanosolar, Inc., San Jose, CA (US)

(*) Notice: Subject to any disclaimer, the term of this patent is extended or adjusted under 35 U.S.C. 154(b) by 0 days.

(21) Appl. No.: 12/786,396

(22) Filed: May 24, 2010

(65) Prior Publication Data
US 2011/0092014 A1    Apr. 21, 2011

Related U.S. Application Data

(60) Provisional application No. 61/180,814, filed on May 22, 2009.

(51) Int. Cl.
*H01L 21/00* (2006.01)
*H01L 29/06* (2006.01)

(52) U.S. Cl. ........... 438/22; 438/24; 438/34; 257/21; 257/22; 257/E31.127; 257/E31.129

(58) Field of Classification Search ........... 438/24–26, 438/28, 34, 39, 22; 257/E31.127, E31.129
See application file for complete search history.

(56) References Cited

U.S. PATENT DOCUMENTS

| | | |
|---|---|---|
| 3,423,301 A | 1/1969 | Sterns |
| 3,586,541 A | 6/1971 | Chamberlin |
| 3,818,324 A | 6/1974 | Espinasse |
| 3,903,427 A | 9/1975 | Pack |
| 3,903,428 A | 9/1975 | DeJong |
| 3,966,499 A | 6/1976 | Yasui |
| 3,966,568 A | 6/1976 | Crossley et al. |
| 4,191,794 A | 3/1980 | Shirland et al. |
| 4,192,721 A | 3/1980 | Fawcett et al. |
| 4,227,942 A | 10/1980 | Hall |
| 4,243,432 A | 1/1981 | Jordan |
| 4,404,422 A | 9/1983 | Green et al. |
| 4,485,264 A | 11/1984 | Izu et al. |
| 4,499,658 A | 2/1985 | Lewis |
| 4,522,663 A | 6/1985 | Ovshinsky et al. |
| 4,536,607 A | 8/1985 | Wiesmann |
| 4,559,924 A | 12/1985 | Wilhelm |

(Continued)

FOREIGN PATENT DOCUMENTS

CN    1036298 A    10/1998

(Continued)

OTHER PUBLICATIONS

J. Jay Wimer in "3-D Chip Scale with Lead-Free Processes" in Semiconductor International, Oct. 1, 2003.

(Continued)

*Primary Examiner* — Hsien Ming Lee
(74) *Attorney, Agent, or Firm* — The Mueller Law Office, P.C.

(57) ABSTRACT

Methods and devices for solar cell interconnection are provided. In one embodiment, the method includes physically alloying the ink metal to the underlying foil (hence excellent adhesion and conductivity with no pre-treatment), and by fusing the solid particles in the ink on the surface (eliminating any organic components) so that the surface is ideally suited for good conductivity and adhesion to an overlayer of finger ink, which is expected to be another adhesive. In some embodiments, contact resistance of conductive adhesives are known to be much lower on gold or silver than on any other metals.

17 Claims, 1 Drawing Sheet

U.S. PATENT DOCUMENTS

| | | | |
|---|---|---|---|
| 4,574,160 A | 3/1986 | Cull | |
| 4,622,432 A | 11/1986 | Yamazaki | |
| 4,642,140 A | 2/1987 | Noufi et al. | |
| 4,677,250 A | 6/1987 | Barnett et al. | |
| 4,755,475 A | 7/1988 | Kiyama et al. | |
| 4,773,944 A | 9/1988 | Nath | |
| 4,786,607 A | 11/1988 | Yamazaki et al. | |
| 4,806,436 A | 2/1989 | Tada et al. | |
| 4,849,029 A | 7/1989 | Delahoy | |
| 4,860,509 A | 8/1989 | Laaly et al. | |
| 4,865,999 A | 9/1989 | Xi et al. | |
| 4,872,925 A | 10/1989 | McMaster | |
| 4,940,604 A | 7/1990 | Suyama et al. | |
| 4,981,525 A | 1/1991 | Kiyama et al. | |
| 5,045,409 A | 9/1991 | Eberspacher et al. | |
| 5,057,163 A | 10/1991 | Barnett et al. | |
| 5,078,804 A | 1/1992 | Chen et al. | |
| 5,093,453 A | 3/1992 | St. Clair et al. | |
| 5,139,959 A | 8/1992 | Craft et al. | |
| 5,141,564 A | 8/1992 | Chen et al. | |
| 5,244,509 A | 9/1993 | Arao et al. | |
| 5,254,179 A | 10/1993 | Ricaud et al. | |
| 5,268,037 A | 12/1993 | Glatfelter | |
| 5,277,786 A | 1/1994 | Kawakami | |
| 5,286,306 A | 2/1994 | Menezes | |
| 5,356,839 A | 10/1994 | Tuttle et al. | |
| 5,401,573 A | 3/1995 | Babel et al. | |
| 5,419,781 A | 5/1995 | Hamakawa et al. | |
| 5,421,908 A | 6/1995 | Yoshida et al. | |
| 5,436,204 A | 7/1995 | Albin et al. | |
| 5,441,897 A | 8/1995 | Noufi et al. | |
| 5,468,652 A | 11/1995 | Gee | |
| 5,501,744 A | 3/1996 | Albright | |
| 5,547,516 A | 8/1996 | Luch | |
| 5,558,723 A | 9/1996 | Ufert | |
| 5,578,503 A | 11/1996 | Karg et al. | |
| 5,587,264 A | 12/1996 | Iijima et al. | |
| 5,626,686 A | 5/1997 | Yoshida | |
| 5,626,688 A | 5/1997 | Probst et al. | |
| 5,633,033 A | 5/1997 | Nishitani et al. | |
| 5,637,537 A | 6/1997 | Nath et al. | |
| 5,667,596 A | 9/1997 | Tsuzuki et al. | |
| 5,674,325 A | 10/1997 | Albright et al. | |
| 5,677,250 A | 10/1997 | Knapp | |
| 5,679,176 A | 10/1997 | Tsuzuki et al. | |
| 5,681,402 A | 10/1997 | Ichinose et al. | |
| 5,730,852 A | 3/1998 | Bhattacharya et al. | |
| 5,733,381 A | 3/1998 | Ota et al. | |
| 5,735,966 A | 4/1998 | Luch | |
| 5,759,291 A | 6/1998 | Ichinose et al. | |
| 5,865,904 A | 2/1999 | Tanda | |
| 5,868,869 A | 2/1999 | Albright et al. | |
| 5,897,715 A | 4/1999 | Ward et al. | |
| 5,925,228 A | 7/1999 | Panitz et al. | |
| 5,928,439 A | 7/1999 | Ota et al. | |
| 5,951,786 A | 9/1999 | Gee et al. | |
| 5,985,691 A | 11/1999 | Basol et al. | |
| 5,994,163 A | 11/1999 | Bodegard et al. | |
| 6,034,322 A | 3/2000 | Pollard | |
| 6,034,810 A | 3/2000 | Robinson et al. | |
| 6,083,801 A | 7/2000 | Ohtani | |
| 6,107,562 A | 8/2000 | Hashimoto | |
| 6,121,541 A | 9/2000 | Arya | |
| 6,124,039 A | 9/2000 | Goetz et al. | |
| 6,127,202 A | 10/2000 | Kapur et al. | |
| 6,130,465 A | 10/2000 | Cole | |
| 6,201,181 B1 | 3/2001 | Azzam et al. | |
| 6,239,352 B1 | 5/2001 | Luch | |
| 6,265,652 B1 | 7/2001 | Kurata et al. | |
| 6,268,014 B1 | 7/2001 | Eberspacher et al. | |
| 6,333,206 B1 | 12/2001 | Ito et al. | |
| 6,359,209 B1 | 3/2002 | Glenn et al. | |
| 6,372,538 B1 | 4/2002 | Wendt et al. | |
| 6,414,235 B1 | 7/2002 | Luch | |
| 6,437,231 B2 | 8/2002 | Kurata et al. | |
| 6,455,347 B1 | 9/2002 | Hiraishi et al. | |
| 6,459,032 B1 | 10/2002 | Luch | |
| 6,468,828 B1 | 10/2002 | Glatfelter et al. | |
| 6,511,861 B2 | 1/2003 | Takeyama et al. | |
| 6,553,729 B1 | 4/2003 | Nath et al. | |
| 6,573,445 B1 | 6/2003 | Burgers | |
| 6,729,081 B2 | 5/2004 | Nath et al. | |
| 6,750,662 B1 | 6/2004 | Van Der Heide | |
| 6,774,497 B1 | 8/2004 | Qi et al. | |
| 6,787,405 B2 | 9/2004 | Chen | |
| 6,803,513 B2 | 10/2004 | Beernink et al. | |
| 6,846,696 B2 | 1/2005 | Adachi et al. | |
| 6,974,976 B2 | 12/2005 | Hollars | |
| 7,122,398 B1 | 10/2006 | Pichler | |
| 7,144,751 B2 | 12/2006 | Gee et al. | |
| 7,170,001 B2 | 1/2007 | Gee et al. | |
| 7,276,724 B2 * | 10/2007 | Sheats et al. | 257/21 |
| 7,507,903 B2 | 3/2009 | Luch | |
| 7,507,971 B2 | 3/2009 | Shibayama et al. | |
| 7,635,810 B2 | 12/2009 | Luch | |
| 7,732,229 B2 * | 6/2010 | Leidholm et al. | 438/22 |
| 7,732,243 B2 | 6/2010 | Luch | |
| 7,838,868 B2 * | 11/2010 | Sheats et al. | 257/21 |
| 7,898,053 B2 | 3/2011 | Luch | |
| 7,898,054 B2 | 3/2011 | Luch | |
| 2001/0020486 A1 | 9/2001 | Tsuge | |
| 2002/0189662 A1 | 12/2002 | Lomparski | |
| 2003/0103181 A1 | 6/2003 | Imayama et al. | |
| 2003/0198587 A1 | 10/2003 | Kaloyeros et al. | |
| 2003/0205270 A1 | 11/2003 | Stanbery | |
| 2003/0227021 A1 | 12/2003 | Yamazaki et al. | |
| 2004/0144419 A1 | 7/2004 | Fix | |
| 2004/0069340 A1 | 8/2004 | Luch | |
| 2004/0187917 A1 | 9/2004 | Pichler | |
| 2004/0214409 A1 | 10/2004 | Farnworth et al. | |
| 2004/0219730 A1 | 11/2004 | Basol | |
| 2004/0261839 A1 | 12/2004 | Gee et al. | |
| 2004/0261840 A1 | 12/2004 | Schmit et al. | |
| 2005/0006714 A1 | 1/2005 | Graetzel et al. | |
| 2005/0061363 A1 | 3/2005 | Ginley et al. | |
| 2005/0072457 A1 | 4/2005 | Glenn | |
| 2005/0087225 A1 | 4/2005 | Morooka et al. | |
| 2005/0109392 A1 | 5/2005 | Hollars | |
| 2005/0117194 A1 | 6/2005 | Kim et al. | |
| 2005/0126621 A1 | 6/2005 | Dinwoodie et al. | |
| 2005/0135724 A1 | 6/2005 | Helvajian et al. | |
| 2005/0172996 A1 | 8/2005 | Hacke et al. | |
| 2005/0172998 A1 | 8/2005 | Gee et al. | |
| 2005/0175856 A1 | 8/2005 | Rogers et al. | |
| 2005/0176164 A1 | 8/2005 | Gee et al. | |
| 2005/0176270 A1 | 8/2005 | Luch | |
| 2005/0183767 A1 | 8/2005 | Yu et al. | |
| 2005/0186342 A1 | 8/2005 | Sager et al. | |
| 2005/0217719 A1 | 10/2005 | Mahieu et al. | |
| 2005/0241692 A1 | 11/2005 | Rubin et al. | |
| 2005/0263178 A1 | 12/2005 | Montello et al. | |
| 2005/0263179 A1 | 12/2005 | Gaudiana et al. | |
| 2005/0263180 A1 | 12/2005 | Montello et al. | |
| 2005/0274408 A1 | 12/2005 | Li et al. | |
| 2006/0030141 A1 | 2/2006 | Weng et al. | |
| 2006/0032752 A1 | 2/2006 | Luch | |
| 2006/0107471 A1 | 5/2006 | Spath et al. | |
| 2006/0118165 A1 | 6/2006 | Van Roosmalen et al. | |
| 2006/0121701 A1 | 6/2006 | Basol | |
| 2006/0121748 A1 | 6/2006 | Brieko | |
| 2006/0157103 A1 * | 7/2006 | Sheats et al. | 136/244 |
| 2006/0160261 A1 * | 7/2006 | Sheats et al. | 438/34 |
| 2006/0180195 A1 | 8/2006 | Luch | |
| 2007/0000537 A1 * | 1/2007 | Leidholm et al. | 136/252 |
| 2007/0186971 A1 * | 8/2007 | Lochun et al. | 136/256 |
| 2007/0283996 A1 | 12/2007 | Hachtmann et al. | |
| 2007/0283997 A1 | 12/2007 | Hachtmann et al. | |
| 2008/0011350 A1 | 1/2008 | Luch | |
| 2008/0020503 A1 * | 1/2008 | Sheats et al. | 438/34 |
| 2008/0053519 A1 | 3/2008 | Pearce et al. | |
| 2008/0227236 A1 | 9/2008 | Luch | |
| 2008/0314433 A1 | 12/2008 | Luch | |
| 2009/0107538 A1 | 4/2009 | Luch | |
| 2009/0111206 A1 | 4/2009 | Luch | |
| 2009/0145551 A1 | 6/2009 | Luch | |

| | | | |
|---|---|---|---|
| 2009/0169722 | A1 | 7/2009 | Luch |
| 2009/0173374 | A1 | 7/2009 | Luch |
| 2009/0223552 | A1 | 9/2009 | Luch |

FOREIGN PATENT DOCUMENTS

| | | |
|---|---|---|
| DE | 2741954 | 3/1979 |
| EP | 0452588 | 10/1991 |
| EP | 793277 | 9/1997 |
| JP | 60000783 | 1/1985 |
| JP | 62-89369 | 4/1987 |
| JP | 63-249379 | 10/1988 |
| JP | 02051282 | 2/1990 |
| JP | 06-196743 | 7/1994 |
| WO | WO89/04062 | 5/1989 |
| WO | WO93/24960 | 12/1993 |
| WO | WO02/084708 | 10/2002 |
| WO | WO2003/001602 | 1/2003 |
| WO | WO2003/001602 A3 | 1/2003 |
| WO | WO2003/007386 | 1/2003 |
| WO | WO2004/100244 | 11/2004 |
| WO | WO2005/006402 | 1/2005 |
| WO | WO2005/018007 | 2/2005 |
| WO | WO2005/076959 | 8/2005 |
| WO | WO2005/076960 | 8/2005 |
| WO | WO2005/086633 | 9/2005 |
| WO | WO2006/033858 | 3/2006 |
| WO | WO2006/078985 | 7/2006 |
| WO | WO2006/078985 A3 | 7/2006 |
| WO | WO2007/022221 | 2/2007 |
| WO | WO2007/022221 A3 | 2/2007 |

OTHER PUBLICATIONS

"Global Soalr Process" slides 9,.10, 11,23,24 presented at 29th IEEE PVSC, Polycrystalline Thin-Film Solar Cells—Manufacturing Technology, Part 2, May 18-25, 2002, New Orleans, LA.
A. Duggal et al., "OLEDs for Lighting: new Approaches" in Organic Light-Emitting Materials and Devices VII edited by Sakya H. Katafi, Paul A. Lane, Proceedings of SPIE vol. 5214 pp. 241-247 (SPIE, Bellingham, WA, Feb. 2004).
Miasole Solution from http://www.miasole.com/solution/asp 2003.
A. Schönecker, D.W.K. Eikelboom, P. Manshanden, M.J.A.A. Goris, G.P. Wyers, et al., Ace Designs: The Beauty of Rear Contact Solar Cells, 29$^{th}$IEEE Photovoltaic Specialists Conference, May 2002.
P.C. De Jong, D.W.K. Eikelboom, R. Kinderman, A.C. Tip, J.H. Bultman, M.H.H. Meuwissen, M.A.C.J. Van Den Nieuwenhof, Single-Step Laminated Full-Size PV Modules Made with Back-Contacted mc-SI Cells and Conductive Adhesives, 19$^{th}$ EPVSEC, Paris, Jun. 2004.
A. Schönecker, D.W.K. Eikelboom, P. Manshanden, M.J.A.A. Goris, G.P. Wyers, et al., Advanced Crystalline Silicon Solar Cell Designs, Final Report of European Commission project, JOR3-CT98-02692, (2001).
A. Schönecker, D.W.K. Eikelboom, P. Manshanden, M.J.A.A. Goris, G.P. Wyers, et al., Ace Designs: The Beauty of Rear Contact Solar Cells, 29$^{th}$ IEEE Photovoltaic Specialists Conference, May 2002 (pre print).
Akahiro Takano, Tomoyoshi Kamoshita, Light-Weight and Large-Area Solar Cell Production Technology, Japanese Journal of Applied Physics, vol. 43, No. 12, 2004, pp. 7976-7983.
K. Tabuchi, S. Fujikake, H. Sato, S. Saito, A. Takano, T. Wada, T. Yoshida, Y. Ichikawa, H. Sakai, F. Natsume, Improvement of Large-Area Scaf Structure A-Si Solar Cells with Plastic Film Substrate, Conference Record of the Twenty-Sixth IEEE Photovoltaic Specialists Conference, Sep. 29-Oct. 3, 1997.
Shinji Fujikake, Masayoshi Uno, Shinji Iwasaki, Yukio Takeda, Takehito Wada, Masayuki Tanda, Akihiro Takano, Takashi Yoshida, Fabrication Technologies for Large-Area Plastic-Film-Substrate Solar Cells, Proceedings of 3rd World Conference on Photovoltaic Energy Conversion, 2003, vol. 2, Issue, May 12-16, 2003 pp. 1760-1763 vol. 2.
J.H. Bultman, D.W.K. Eikelboom, R. Kinderman, A.C. Tip, C.J.J. Tool, et al., Fast and Easy Single Step Module Assembly for Back-Contacted C-Si Solar Cells with Conductive Adhesives, Proceedings of 3rd World Conference on Photovoltaic Energy Conversion, 2003, Publication Date: May 11-18, 2003 Volume: 1, on pp. 979-982 vol. 1.
H. Knauss, P. Fath, W. Jooss, M. Mccann, E. Ruland, S. Steckemetz, Large Area Metallisation Wrap Through Solar Cells With Thickfilm Metallisation, 20th European Solar Energy Conference and Exhibition, Jun. 6-10, 2005 Barcelona, Spain.
E. Van Kerschaver, C. Allebe, G. Beaucarne, Optimized Adaptive Back Contacted Solar Cells, 19th EPVSEC, Paris, Jun. 2004.
A. R. Burgers, J.A. Eikelboom, Optimizing Metalization Patterns for Yearly Yield, Conference Record of the Twenty-Sixth IEEE Photovoltaic Specialists Conference, Sep. 29-Oct. 3, 1997 pp. 219-222.
A. Schönecker, H.H.C. De Moor, A.R. Burgers, A.W. Weeber, J. Hoornstra, et al., An Industrial Multi-Crystalline EWT Solar Cell With Screen Printed Metallisation, 14th Eur. Photovoltaic Solar Energy Conference and Exhibition, Barcelona, Spain, (1997).
J.H. Bultman, A.W. Weeber, M.W. Brieko, J. Hoonstra, et al., Pin Up Module: A Design for Higher Efficiency, Easy Module Manufacturing and Attractive Appearance, ECN-RX—00-010; May, 2000; 4 pag.; Presented at 16th European Photovoltaic Solar Energy Conference and Exhibition, Glasgow, Scotland, May 1-5, 2000.
James M. Gee, Stephan E. Garrett, William P. Morgan, Simplified Module Assembly Using Back-Contact Crystalline-Silicon Solar Cells, Conference Record of the Twenty-Sixth IEEE Photovoltaic Specialists Conference, Sep. 29-Oct. 3, 1997.
A.R. Burgers, J.H. Bultman, A.C. Tip, W.C. Sinke, Metallisation Patterns for Interconnection Through Holes, Solar Energy Materials & Solar Cells 65 (2001) 347-353.
J.H. Bultman, M.W. Brieko, A.R. Burgers, J. Hoornstra, A.C. Tip, A.W. Weeber, Interconnection Through Vias for Improved Efficiency and Easy Module Manufacturing of Crystalline Silicon Solar Cells, Solar Energy Materials & Solar Cells 65 (2001) 339-345.
A.R. Burgers, How to Design Optimal Metallisation Patterns for Solar Cells, Prog. Photovolt: Res. Appl. 7, 457-461 (1999).
Bultman, J.H.; Eikelboom, D.W.K.; Kinderman, R.; Tip, A.C.; Weeber, A.W.; Meuwissen, M.H.H.; Nieuwenhof, M.A.C.J. Van Den; Michiels, P.P.; Schoofs, C.; Schuurmans, F.M., Selecting optimal interconnection methodology for easy and cost efficient Manufacturing of the pin up module ECN-RX—02-051; Oct. 2002; 4 pag.; Presented at PV in Europe—From PV Technology to Energy Solutions Conference and Exhibition, Rome, Italy, Oct. 7-11, 2002.
Eikelboom, D.W.K.; Bultman, J.H.; Schonecker, a.; Meuwissen, M.H.H.; Nieuwenhof, M.A.C.J. Van Den; Meier, D.L., Conductive adhesives for low-stress interconnection of thin back-contact solar cells ECN-RX—02-052; Oct. 2002; 4 pag.; Presented at PV in Europe—From PV Technology to Energy Solutions Conference and Exhibition, Rome, Italy, Oct. 7-11, 2002.
Eikelboom, D.W.K.; Burgers, A.R.; Goris, M.J.A.A.; Manshanden, P.; Schonecker, A.; Wyers, G.P., Conductive adhesives for interconnection of busbarless emitter wrap-through solar cells on a structured metal foil, ECN-RX—01-016; Oct. 2001; 4 pages; Presented at 17th European Photovoltaic Solar Energy Conference, Munich, Germany, Oct. 22-26, 2001.
E. Van Kerschaver, S. De Wolf, C. Allebe, J. Szlufcik, High Performance Modules Based on Back Contacted Solar Cells, 17th Dur. PV Solar Energy Conf., Munich, Germany, Oct. 2001.
Kray, et al, "High-Efficiency Emitter-Wrap-Through Cells", 17.sup.th EU-PVSEC Munich (2001), Oct. 2001.
David D. Smith, James M. Gee, Review of Back Contact Silicon Solar Cells for Low Cost Application, 16$^{th}$European Photovoltaic Solar Energy Conference, Glasgow, May 2000.
H. Knauss, W. Jooss, S. Roberts, T.M. Bruton, R. Toelle, P. Fath, E. Bucher, Emitter Wrap Through Solar Cells using Electroless Plating Metallisation, 17th European PVSEC, Oct. 2001 Paper VC3-9.
Yukimi Ichikawa, Shinji Fujikake, Katsuya Tabuchi, Toshiaki Sasaki, Toshio Hama, Takashi Yoshida, Hiroshi Sakai, Misao Saga, Flexible A-Si Based Solar Cells with Plastic Film Substrate, Mst. Res. Soc. Symp. Proc. vol. 557. (1999) p. 703-712.
T. Yoshida, S. Fujikake, S. Kato, M. Tanda, K. Tabuchi, A. Takano, Y. Ichikawa, H. Sakai, Development of Process Technologies for Plastic-film Substrate Solar Cells, Solar Energy Materials and Solar Cells 48 (1997) 383-391.

Office Action from Chinese patent application Ser. No. 200680006141.8 Mar. 6, 2009.
U.S. Appl. No. 11/427,328 filed on Jun. 28, 2006 which is Pending claims the benefit of U.S. Appl. No. 11/207,157.
U.S. Appl. No. 11/933,416 filed on Oct. 31, 2007 which is Pending claims the benefit of U.S. Appl. No. 11/207,157.
U.S. Appl. No. 11/762,040 filed on Jun. 12, 2007 which is Pending claims the benefit of U.S. Appl. No. 11/207,157.
U.S. Appl. No. 11/762,043 filed on Jun. 12, 2007 which is Pending claims the benefit of U.S. Appl. No. 11/207,157.
U.S. Appl. No. 11/762,048 filed on Jun. 12, 2007 which is Pending claims the benefit of U.S. Appl. No. 11/207,157.
U.S. Appl. No. 11/278,648 filed on Apr. 4, 2006 which is Pending claims the benefit of U.S. Appl. No. 11/207,157.
U.S. Appl. No. 11/278,645 filed on Apr. 4, 2006 which is Pending claims the benefit of U.S. Appl. No. 11/207,157.
U.S. Appl. No. 12/064,031 filed on Feb. 16, 2008 which is Pending claims the benefit of U.S. Appl. No. 11/207,157.
Chinese Office Action from Chinese Application 200580036909.1 Jun. 20, 2008.
Chinese Office Action from Chinese Application 200580036909.1 Feb. 6, 2009.
Chinese Office Action from Chinese Application 200580036909.1 Sep. 25, 2009.
European Office Action from EP application 05 796 064.3 Mar. 10, 2008.
European Office Action from EP application 05 796 064.3 Oct. 19, 2007.
S. Wiedeman et al. "CIGS Processing on a Flexible Polyimide Substrates" Proc. 2001 NCPV Program Review Meeting, p. 49-50 (2001).
Chinese Office Action from Chinese Application 20060034955.2 Aug. 12, 2010.
Chinese Office Action from Chinese Application 20060034955.2 Aug. 15, 2011.
PCT Written Opinion for WO2007106756 dated Sep. 29, 2008.
Office Action from Chinese patent application Ser. No. 200680006141.8 Mar. 30, 2011.
Ki Tae Nam, Arindom Datta, Soo-Hyun Kim, and Ki-Bum Kim, Improved diffusion barrier by stuffing the grain boundaries of TiN with a thin Al interlayer for Cu metallization, Applied Physics Letters, Oct. 15, 2001, 2549-2551, vol. 79, No. 16, American Institute of Physics, New York.
Vijay K. Kapur, Ashish Bansal, Phucan Le, and Omar I. Asensio, Non-vacuum processing of CuIni,GaxSe2 solar cells on rigid and flexible substrates using nanoparticle precursor inks, Thin Solid Films, 2003, 53-57, vol. 431-432, Elsevier Publishing Company, Amsterdam.
Markus E. Beck, and Michael Cocivera, Thin-film copper indium diselenide prepared by selenization of copper indium oxide formed by spray pyrolysis, Thin Solid Films, 1996, 71-82, vol. 272, Elsevier Publishing Company, Amsterdam.
W. Sinke, G. P. A. Frijlink, and F. W. Saris, Oxygen in titanium nitride diffusion barriers, Applied Physics Letters, Sep. 1, 1985, 471-473, vol. 47, No. 5, American Institute of Physics, New York.
C. Eberspacher, K. Pauls, and J. Serra, Non-vacuum processing of CIGS solar cells, UNISUN, 223-224, 2001, Newbury Park, CA.
T. Arita, N. Suyama, Y. Kita, S. Kitamura, T. Hibino, H. Takada, K. Omura, N. Ueno, and M. Murozono, CuInSe2 films prepared by screen-printing and sintering method, 1988, IEEE.
J.-S. Chun, P. Desjardins, C. Lavoie, C.-S. Shin, C. Cabral, Jr., I. Petrov and J. E. Greene, Interfacial reactions in epitaxial Al/TiN(111) model diffusion barriers: Formation of an impervious self-limited wurtzite-structure AlN(0001) blocking layer, Journal of Applied Physics, Jun. 15, 2001, 7841-7845, vol. 89, No. 12, American Institute of Physics, New York.
Douglas L. Schulz, Calvin J. Curtis, Rebecca A. Flitton, Holm Wiesner, James Keane, Richard J. Matson, Kim M. Jones, Philip A. Parilla, Rommel Noufi, and David S. Ginley, Cu-In-Ga-Se Nanoparticle Colloids as Spray Deposition Precursors for Cu(In, Ga)Se$_2$ Solar Cell Materials, Journal of Electronic Materials, 1998, 433-437, vol. 27, No. 5, Minerals Metals & Materials Society : USA.
Soo-Hyun Kim, Ki Tae Nam, Arindom Datta, and Ki-Bum Kim, Failure mechanism of a multilayer (TiN/Al/TiN) diffusion barrier between copper and silicon, Journal of Applied Physics, Nov. 1, 2002, 5512-5519, vol. 92, No. 9, American Institute of Physics, New York.
Claire J. Carmalt, Daniel E. Morrison, and Ivan P. Parkin, Solid-state and solution phase metathetical synthesis of copper indium chalcogenides, Journal of Materials Chemistry, 1998, 2209-2211, vol. 8, No. 10, Royal Society of Chemistry (Great Britain).
A. Kohlhase, M. Mandl, and W. Pamler, Performance and failure mechanisms of TiN diffusion barrier layers in submicron devices, Journal of Applied Physics, Mar. 15, 1989, 2464-2469, vol. 65, No. 6, American Institute of Physics, New York.
Shixing Weng and Michael Cocivera, Preparation of copper indium diselenide by selenization of copper indium oxide, Journal of Applied Physics, Aug. 1, 1993, 2046-2052, vol. 74, No. 3, American Institute of Physics, New York.
G.. Norsworthy, C.R. Leidholm, A. Halani, V.K. Kapur, R. Roe, B.M. Basol, and R. Matson, CIS film growth by metallic ink coating and selenization, Solar Energy Materials & Solar Cells, 2000, 127-134, vol. 60, Elsevier Science, Amsterdam : Netherlands.
J. O. Olowolafe, Jian Li, J. W. Mayer, and E. G. Colgan, Effects of oxygen in TiNx on the diffusion of Cu in Cu/TiN/Al and Cu/TiNx/Si structures, Applied Physics Letters, Feb. 4, 2001, 469-471, vol. 58, No. 5, American Institute of Physics, New York.
Chris Eberspacher, Chris Fredric, Karen Pauls, and Jack Serra, Thin-filme CIS alloy PV materials fabricated using non-vacuum, particles-based techniques, Thin Solid Films, 2001, 18-22, vol. 387, Elsevier Publishing Company, Amsterdam.
Hoo-Jeong Lee, Robert Sinclair, Pamela Li, and Bruce Roberts, A study of the failure mechanism of a titanium nitride diffusion barrier, Journal of Applied Physics, Sep. 15, 1999, 3096-3103, vol. 86, No. 6, American Institute of Physics, New York.
Chris Eberspacher, Karen L. Pauls, and John P. Serra, Non-vacuum thin-film CIGS modules, Materials Research Society Symposia Proceedings, 2003, B8.27.1-B8.27.6, vol. 763, Materials Research Society, Warrendale, PA.
M. Mandl, H. Hoffmann, and P. Kucher, Diffusion barrier properties of Ti/TiN investigated by transmission electron microscopy, Journal of Applied Physics, Sep. 1, 1990, 2127-2132, vol. 68, No. 5, American Institute of Physics, New York.
M. Kaelin, D. Rudmann, F. Kurdesau, T. Meyer, H. Zogg, A.N. Tiwari, CIS and CIGS layers from selenized nanoparticle precursors, Thin Solid Films, 2003, 58-62, vol. 431-432, Elsevier Science, Amsterdam : Netherlands.
M. Kaelin, H. Zogg, A.N. Tiwari, O. Wilhelm, S.E. Pratsinis, T. Meyer, and A. Meyer, Electrosprayer and selenized Cu/in metal particle films, Thin Solid Films, 2004, 391-396, vol. 457, Elsevier Science, Amsterdam : Netherlands.
R.P. Raffaelle, J.G. Mantovani, S.G. Bailey, A.F. Hepp, E.M. Gordon and R. Haraway, Electrodeposited CuInSe$_2$ thin film junctions, Prepared for the 1997 Fall meeting sponsored by the Materials Research Society, Dec. 1-5, 1997, Boston, MA.
K.T. Ramakrishna Reddy, R.B.V. Chalapathy, M.A. Slifkin, A.W. Weiss, and R.W. Miles, Photoacousstic spectroscopy of sprayed CuGa$_x$In$_{1-xSe2}$ thin films, Thin Solid Films, 2001, 205-207, vol. 387, Elsevier Science, Amsterdam : Netherlands.
C. Guillen, and J. Herrero, Recrystallization and components redistribution processes in electrodeposited CuInSe$_2$ thin films, Thin Solid Films, 2001, 57-59, vol. 387, Elsevier Science, Amsterdam : Netherlands.
K.T.L. De Silva, W.A.A. Priyantha, J.K.D.S. Jayanetti, B.D. Chithrani, W. Siripala, K. Blake, and I.M. Dharmadasa, Electrodeposition and characterization of CuInSe$_2$ for applications in thin film solar cells, Thin Solid Films, 2001, 158-163, vol. 382, Elsevier Science, Amsterdam : Netherlands.
A. G. Munoz, S. B. Saidman, and J. B. Bessone, Electrodeposition of Indium onto Vitreous Carbon from Acid Chloride Solutions, Journal of the Electrochemical Society, 1999, 2123-2130, vol. 146, No. 6, Electrochemical Society Inc : USA.
D. Padhi, J. Yahalom, S. Gandikota, and G. Dixit, Planarization of Copper Thin Films by Electropolishing in Phosphoric Acid for ULSI Applications, Journal of the Electrochemical Society, 2003, G10-G14, vol. 150, No. 1, Electrochemical Society Inc : USA.

George L. Schnable and John G. Javes, Electrodeposition of Molten Low-Melting Metals and Alloys from Fused-Salt Systems, Electrochemical Technology, Jul.-Aug. 1964, 201-206, Electrochemical Society, Manchester, N.H.

George L. Schnable, Electrodeposition of Molten Metals and Alloys from Glycerine Solutions, Jounal of the Electrochemical Society, Oct. 1961, 964-969, vol. 108, No. 10, Electrochemical Society Inc : USA.

William M. Saltman and Norman H. Nachtrieb, The Electrochemistry of Gallium, Journal of the Electrochemical Society, Mar. 1953, 126-130, vol. 100, No. 3, Electrochemical Society Inc: USA.

Marianna Kemell, Heini Saloniemi, Mikko Ritala, and Markku Leskela, Electrochemical Quartz Crystal Microbalance Study of the Electrodeposition Mechanisms of CuInSe2 Thin Films, Journal of the Electrochemical Society, 2001, C110-C118, vol. 148, No. 2, Electrochemical Society: USA.

L. Gao, J. Gstottner, R. Emling, M. Balden, Ch. Linsmeier, A. Wiltner, W. Hansch, and D. Schmitt-Landsiedel, Thermal stability of titanium nitride diffusion barrier films for advanced silver interconnects, Microelectronic Engineering, Oct. 2004, 76-81, vol. 76, Issue 1-4, Elsevier Science Ltd., Oxford, UK.

A. Kampmann, P. Cowache, D. Lincot, and J. Vedel, Juction Formation Studies of One-Step Electrodeposited $CuInSe_2$ on CdS, Journal of The Electrochemical Society, 1999, 150-155, vol. 146, No. 1, Royal Society of Chemistry (Great Britain).

Arindom Datta, Ki Tae Name, Soo-Hyun Kim, and Ki-Bum Kim, Optimization of Al interlayer thichness for the multilayer diffusion barrier scheme in Cu metallization, Journal of Applied Physics, Jul. 15, 2002, 1099-1105, vol. 92, No. 2, American Institute of Physics, New York.

J. Bonitz, S.E. Schultz, T. Gessner, Ultra Thin CVD TiN Layers As Diffusion Barrier Films on Porous Low-K Mateirals, Microelec. Eng. V76, p28, 2004.

J.X. Liao, L.F. Xia, M.R. Sun, W.M. Liu, T.Xu, C.R. Yang, H.W. Chen, C.L. Fu, W.J. Leng, Structural Characteristics of 2024 Aluminum Alloy Plasma-based Ion Implanted with Nitrogen then Titanium, Applied Surface Sciences 240, online Sep. 2, 2004, Elsevier Science Ltd., Oxford, UK.

C. Eberspacher, K. Pauls, and J. Serra, Non-vacuum processing of CIGS solar cells, UNISUN, pp. 1-5, 2003 Newbury Park, CA.

Xue et al., "4.2% efficient organic photovoltaic cells with low series resistances", Appl. Phys. Lett. 84, 3013 (2004).

* cited by examiner

SOLAR CELL INTERCONNECTION

CROSS-REFERENCE TO RELATED APPLICATION

This application claims priority to U.S. Provisional Application Ser. No. 61/180,814 filed May 22, 2009 and fully incorporated herein by reference for all purposes.

This invention was made with Government support under Contract No. DE-FC36-07GO17047 awarded by the Department of Energy. The Government has certain rights in this invention.

FIELD OF THE INVENTION

This invention relates to solar cells and more specifically to back-contacted solar cells.

BACKGROUND OF THE INVENTION

There is a need for an improved back-contacted solar cell with improved manufacturability.

SUMMARY OF THE INVENTION

The disadvantages associated with the prior art are overcome by embodiments of the present invention. Embodiments of the invention may be used for high throughput, high precision manufacturing for roll-to-roll production systems. The embodiments are applicable to various thin film absorbers such as but not limited to polycrystalline CIGS (copper indium gallium di-selenide, but not excluding any other of the IB, IIIA, VIA elements like e.g. aluminum, and sulfur).

In on embodiment, the vias which are a part of the metal wrap through (MWT) structure are partially filled with a silver-containing ink, and the dried (i.e. solvent-free) ink is then irradiated with a pulsed laser with sufficient energy to both fuse the silver particles and melt the aluminum foil underneath, creating an Ag—Al alloy. A pulsed laser or other energy source may be used in order to minimize any degradation of cell performance around the via. Typically the layer would be only a few microns thick, probably between 1 and 10 microns.

The technique will work with any commercial conductive adhesive, including those with polymer binders, since the organic material would be vaporized by the laser pulse. However, an especially attractive material is that marketed by Cabot Corporation, for example, which has low-melting inorganic glasses surrounding the silver particles.

A further understanding of the nature and advantages of the invention will become apparent by reference to the remaining portions of the specification and drawings.

DESCRIPTION OF THE SPECIFIC EMBODIMENTS

Figure 1:
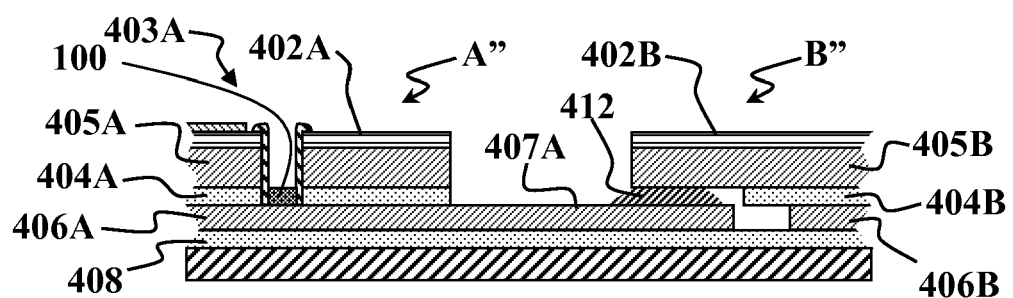
FIG. 1 shows one embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

Abstract/Brief Summary

The vias which are a part of the metal wrap through cell structure are partially filled with a conductive ink, and the dried ink is then irradiated with a pulsed laser with sufficient energy to both fuse the solid ink components and melt the metal foil underneath, creating a metal alloy. A pulsed laser is used in order to minimize any degradation of cell performance around the via.

Typically the layer would need to be only less than 10 microns. The technique will work with any commercial conductive material, including those with organic materials, since the organic material would be vaporized by the laser pulse.

Background

The problem with the existing methods for creating contacts to the backside electrode is that it is not easy to get a low contact resistance, and to have that interface remain stable through hot humidity aging. Most metal foils must be treated in some way, because its oxide surface makes a bad electrical contact to silver adhesives. Sn plating provides a much better interface (at some expense), but the contact resistance is still an issue, and it is desirable to make the contact area even less than at present in order to save money on silver inks.

What is/are the Key Innovation(s), Improvements, Etc

The main improvement is provided by physically alloying the ink metal to the underlying foil (hence excellent adhesion and conductivity with no pre-treatment), and by fusing the solid particles in the ink on the surface (eliminating any organic components) so that the surface is ideally suited for good conductivity and adhesion to an overlayer of finger ink, which is expected to be another adhesive. (Contact resistance of conductive adhesives are known to be much lower on gold or silver than on any other metals.) The result is not only improved reliability and less power loss due to contact resistance, but lower materials costs since the contact can be made narrower (smaller diameter). This can be done by increasing the thickness of the secondary insulator.

Figure 2:
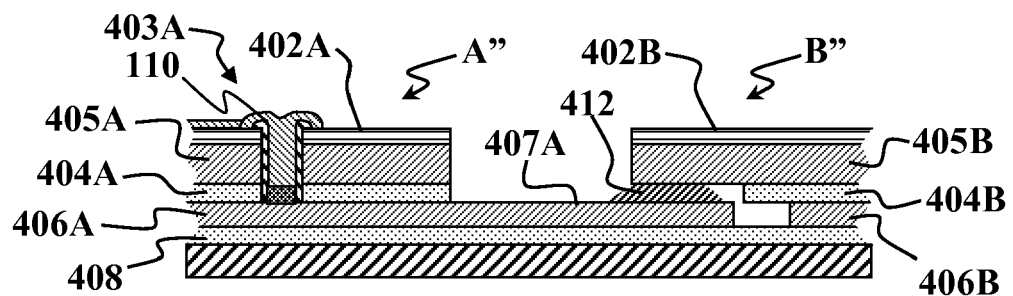
FIG. 2 shows one embodiment of the present invention.

FIGS. 1-2 depict one embodiment of a solar cell with a plurality of vias. First and second device cells A", B" are assembled from pre-cut device layers 402A, 402B, insulating layers 404A, 404B and back plane layers 406A, 406B and attached to a carrier substrate 408. Insulated electrical contacts 403A make electrical contact through the device layers 402A, a bottom electrode 405A and the insulating layer 406A as shown in FIG. 1. Front edges of the insulating layer 404B and back plane 406B of module B" are cut back (or formed in this configuration) with respect to the device layer 402B. To facilitate electrical contact, however, a back edge of the back plane 406A of cell A" extends beyond the back edges of the device layer 402A and insulating layer 404A. As a result, the device layer 402B of cell B" overlaps the back plane 406A of module A". A ridge of conductive adhesive 412 on an exposed portion 407A of the back plane 406A makes electrical contact with an exposed portion of a bottom electrode 405B of the device layer 402B as shown in FIG. 1. The connection at 412 can optionally be formed by other methods such as but not limited to soldering or the like. Optionally, some may remove the element 412 and form the connection by welding such as but not limited to laser welding, ultrasonic welding, spot welding, or other electrical joining techniques. Some embodiments may weld from the backside of cells, through the layer to create the joint between the cells at where reference 412 number is located.

FIG. 1 shows that the via is partially filled by the material 100 such as but not limited to a conductive ink. The dried ink is then irradiated with a pulsed laser or other rapid heating to create the connection. This embodiment of the invention also eliminates the need for a coating or other surface treatment to be applied to the metal foil.

FIG. 2 shows that optionally, the rest of the via can be filled with other conductive material 110 which is the same or different from that used in material 100.

Describe Options/Alternative Embodiments

Depending on the selection of materials, it may not be necessary to heat the metal foil surface to the melting point in order to get the desired level of adhesion and conduction. Also, other conducting particles may be used.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, it should be understood that they are not limited to any one type of thin-film absorber material. They may be formed in roll to roll or in batch configuration. By way of nonlimiting example, the attachment of two metal layers is of use in embodiments such as those found in U.S. patent application Ser. No. 11/207,157. Fusing equipment may be found with reference to DELA Incorporated 175 Ward Hill Avenue Ward Hill, Mass.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, copper-indium-gallium-selenium (for CIGS solar cells), CdSe, CdTe, $Cu(In,Ga)(S,Se)_2$, $Cu(In,Ga,Al)(S,Se,Te)_2$, Cu—In, In—Ga, Cu—Ga, Cu—In—Ga, Cu—In—Ga—S, Cu—In—Ga—Se, other absorber materials, II-VI materials, IB-VI materials, CuZnTe, CuTe, ZnTe, IB-IIB-IVA-VIA absorbers, or other alloys, other absorber materials, IB-IIB-IVA-VIA absorber solar cells, or other alloys and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., U.S. Patent Application Publication US 2005-0121068 A1, which is incorporated herein by reference), a polymer/blend cell architecture, organic dyes, and/or $C_{60}$ molecules, and/or other small molecules, microcrystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . .
.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method of solar cell manufacturing, the method comprising:
   providing a photovoltaic device layer having a plurality of vias therethrough;
   partially filling the vias with a liquid, electrically conductive material;
   heating the liquid, electrically conductive material with sufficient energy to fuse a portion of metal foil underneath the vias with solid ink components in the liquid, electrically conductive material with the metal foil to form a metal alloy; and
   filling the vias with additional electrically conductive material.

2. The method of claim 1 wherein solar cell has a metal wrap through (MWT) structure.

3. The method of claim 1 wherein the liquid, electrically conductive material comprises a silver-containing ink.

4. The method of claim 1 further comprising drying the liquid, electrically conductive material to make the material solvent-free.

5. The method of claim 1 wherein heating comprises irradiating with a pulsed laser with sufficient energy.

6. The method of claim 1 wherein solid ink components comprises silver particles.

7. The method of claim 1 wherein the metal foil comprises aluminum foil underneath.

8. The method of claim 1 wherein solid ink components comprises silver particles and the metal foil comprises aluminum foil underneath, creating an Ag—Al alloy.

9. The method of claim 1 heating comprises using a pulsed laser.

10. The method of claim 1 wherein partially filling forms a layer with a thickness between 1 and 10 microns in the vias.

11. The method of claim 1 wherein the liquid, electrically conductive material comprises conductive adhesive with polymer binder.

12. The method of claim 1 wherein organic material in the liquid, electrically conductive material is vaporized during heating.

13. The method of claim 1 the liquid, electrically conductive material comprises inorganic glasses surrounding silver particles.

14. The method of claim 1 comprises alloying metal in the liquid, electrically conductive material to the metal foil.

15. The method of claim 1 comprises fusing solid particles in solid ink components.

16. The method of claim 1 comprises no pre-treatment of the metal foil to remove oxides.

17. The method of claim 1 wherein fully filling the vias uses an electrically conductive material different from the liquid, electrically conductive material.

* * * * *